United States Patent
Bäcker

(10) Patent No.: US 7,884,050 B2
(45) Date of Patent: Feb. 8, 2011

(54) BAND-SHAPED HIGH-TEMPERATURE SUPERCONDUCTOR (HTSL) AND METHOD OF PRODUCING

(75) Inventor: Michael Bäcker, Köln (DE)

(73) Assignee: Zenergy Power GmbH (DE)

( * ) Notice: Subject to any disclaimer, the term of this patent is extended or adjusted under 35 U.S.C. 154(b) by 901 days.

(21) Appl. No.: 11/735,540

(22) Filed: Apr. 16, 2007

(65) Prior Publication Data

US 2007/0249841 A1      Oct. 25, 2007

(30) Foreign Application Priority Data

Apr. 20, 2006   (DE) ................... 10 2006 018 301

(51) Int. Cl.
*H01L 39/00* (2006.01)
*H01L 39/12* (2006.01)
*B05D 5/12* (2006.01)

(52) U.S. Cl. .................. 505/237; 505/238; 505/434; 505/470; 505/741; 427/62

(58) Field of Classification Search .......... 505/235, 505/238, 123, 236, 237, 780; 428/701
See application file for complete search history.

(56) References Cited

U.S. PATENT DOCUMENTS

| | | | | |
|---|---|---|---|---|
| 6,638,895 B1 * | 10/2003 | Karapetrov et al. | ......... | 505/320 |
| 2001/0056041 A1 * | 12/2001 | Jia et al. | ..................... | 505/100 |
| 2003/0073584 A1 * | 4/2003 | Akasegawa et al. | ......... | 505/100 |
| 2005/0159298 A1 * | 7/2005 | Rupich et al. | ............... | 502/100 |
| 2006/0094603 A1 * | 5/2006 | Li et al. | ..................... | 505/445 |

* cited by examiner

*Primary Examiner*—Stanley Silverman
*Assistant Examiner*—Kallambella Vijayakumar
(74) *Attorney, Agent, or Firm*—Edell, Shapiro & Finnan, LLC

(57) ABSTRACT

A band-shaped high-temperature superconductor (HTSL) with high critical current density can be produced economically in a wet-chemical process. In the process, a first precursor solution is applied to a carrier, dried, and annealed. Additional precursor solutions may then be applied, with the first precursor solution contain little or no pinning centers, and any subsequent precursor solutions contains a higher concentration of pinning centers than the first precursor solutions.

36 Claims, No Drawings

BAND-SHAPED HIGH-TEMPERATURE SUPERCONDUCTOR (HTSL) AND METHOD OF PRODUCING

CROSS REFERENCE TO RELATED APPLICATIONS

This application claims priority under 35 U.S.C. §119 to Application No. DE 102006018301.0 filed on Apr. 20, 2006, entitled "Wet-Chemical Process for the Production of an HTSL," the entire contents of which are hereby incorporated by reference.

FIELD OF THE INVENTION

The invention relates to a band-shaped, high-temperature superconductors (HTSL) and, in particular, to a wet-chemical process that produces an HTSL including pinning centers and a high degree of texture.

BACKGROUND

Pinning centers may be used to increase critical current density or the critical magnetic flux density of an HTSL. This increase results from a spatial fixing of the magnetic flux lattices running through the current-penetrated HTSL orthogonally with respect to the direction of flow by the pinning centers. Such fixing is produced by any disruption of the uniform crystal structure of the HTSL, i.e., by a break in the translational symmetry of the lattice. Thus, any disruption of the lattice symmetry is a pinning center. For example, nanoparticles (e.g., particles with a diameter of between about 1 nm and about 200 nm) or atomic defects may serve as disruptions to the lattice symmetry. To produce an HTSL with pinning centers, a precursor solution may be doped in a targeted manner, for example, by adding nanoparticles that are insoluble in the precursor solution. Alternatively or in addition to, soluble substances such as metal salts may be added to the precursor solution, with the metals causing lattice defects. Thus, the term "pinning center" also includes the use of additives in the precursor solution that cause lattice faults in the HTSL that can pin the magnetic flux lattices.

In the wet-chemical production of HTSL, however, pinning centers prevent a textured growth of the HTSL layer on a textured carrier. This, in turn, reduces the HTSL critical current density, which is undesirable. Thus, providing a wet chemical process for forming an HTSL with pinning centers, wherein the HTSL is highly textured and possesses a high critical current density would prove beneficial.

SUMMARY

The current invention is directed toward a highly textured HTSL with pinning centers and, in particular, to a wet chemical process for forming an HTSL having high critical current density. The process includes the application of a first precursor solution to a carrier, the drying of the solution, and a subsequent annealing treatment. The first precursor solution may be free or substantially free of pinning centers. A second precursor solution may then be applied to the first precursor solution. The second precursor solution contains a higher concentration of pinning centers than the first precursor solution. Additional precursor solutions may be applied to the carrier, with each precursor solution containing a predetermined concentration of pinning centers. Utilizing this process, a band-shaped high-temperature superconductor (HTSL) with high critical current density can be produced economically in a wet-chemical process.

DETAILED DESCRIPTION

In the wet chemical process in accordance with an embodiment of the present invention, a band-shaped HTSL is formed by applying at least two precursor solutions onto a carrier. The precursor solution is dried, and then the HTSL layer is produced utilizing an annealing treatment, wherein the HTSL is pyrolyzed and subsequently sintered. The carrier may include a metal substrate or a ceramic material substrate. Preferably, the carrier includes a buffer layer to ensure a textured deposition of the HTSL onto the carrier. The HTSL may include any type-II superconductor deposited by wet-chemical process. The pinning centers can be formed in the HTSL by adding pinning-center-causing substances to the precursor solution. These substances may include, but are not limited to, soluble metal salts, excess metal in the precursor solution, or insoluble nanoparticles (wherein the precursor solution is a suspension).

In a particular embodiment, the HTSL may be formed by successively applying precursor solutions with varying concentrations of pinning centers. For example, the first precursor solution (the solution that is first applied to the carrier and/or buffer layer) may possess a low concentration of pinning centers, with subsequently applied precursor solutions having a higher concentration of pinning centers than the first precursor solution. By way of specific example, the first precursor solution may be free or substantially free of pinning centers and a second precursor solution may contain pinning centers. As a result, the concentration of the pinning centers in the HTSL layer decreases at least in the direction of the carrier.

If a third layer is applied to the second layer, the third layer may have a lower concentration of pinning centers than the second layer (but higher than the concentration of first precursor solution). By way of further example, if three or more precursor solution layers are applied, alternating concentrations are preferred. Layers with a low concentration of pinning centers are preferably applied thinner than layers with a higher concentration. Increasing the number of precursor layers applied to the carrier also provides an HTSL with increased thickness.

Utilizing this process, the texture of the buffer layer is readily transferred to the HTSL, while providing the finished HTSL with pinning centers. The resulting HTSL not only includes a high degree of texturing, but also includes pinning centers, both of which produces an HTSL with a critical current density that is increased compared to HTSL formed utilizing conventional wet chemical processes.

As pinning centers, nanoparticles with a mean diameter of less than 200 nm may be utilized and preferably less than 110 nm. The nanoparticles may possess a mean maximum diameter (grain size) in the range of about 2 nm to about 80 nm, and preferably in the range of about 5 nm to about 60 nm. The nanoparticles are preferably largely inert compared to the HTSL and its educts.

The lattice vectors of the nanoparticles may be similar to the lattice vectors of the HTSL layer. For example, the length of a lattice vector of the nanoparticles can be similar to the length of a lattice vector of the HTSL (or a whole-number multiple thereof). Thus, if the HTSL is a cuprate-SL, two of the lattice vectors of the nanoparticles that are used and that are similar in length and/or angle to the lattice vectors of the CuO plane of the cuprate-SL are preferred. For example, length and angle of the corresponding vectors may deviate from one another by less than about 10%. As a result, the lattice defect caused by a nanoparticle "heals" in the area near the nanoparticle, by which the effective superconducting volume of the HTSL increases.

In accordance with an embodiment of the invention, to produce HTSL layers with pinning centers, precursor solutions are formed that contain zirconium oxide, stabilized zirconium oxide, cerium oxide, barium zirconate, lanthanum zirconate, or yttrium oxide can be used. Likewise, $RE_2Ba_4CaMo_y$ can also be utilized, whereby RE stands for any rare earth metals; M stands for Zr, Nb, Mo, Ru, Hf, Ta, W or Sn; and y stands for a rational number of greater than 0.

The wet chemical process, then, may include forming a precursor solution, providing a carrier, applying the precursor solution to the carrier, drying the solution to form a layer, and annealing the layer. The application of the precursor solution may be repeated at least i times (i being a natural number that is greater than 0), wherein the precursor solution has a concentration $c_o$ of pinning centers that is smaller than the concentration $c_1$ of the solution that is applied in the first repetition (i=1) such that $0 \leq c_o < c_1$. By way of example, the concentration of pinning centers in the first precursor solution may be less than about 10% of the concentration pinning centers applied in the first repetition (thus, $c_o \leq 1/10\ c_1$, and preferably, $c_o \approx 0$). By way of further example, the HTSL may be formed such that $c_i < c_{i+1}$, wherein i is an even natural number that is greater than 0.

In another embodiment, $c_i$ may be less than (<) $c_{i+1}$, and i may be an even natural number that is greater than 0. Furthermore, for layers i and j, with $c_i$ being less than (<) $c_j$, it may hold true that $d_i < d_j$, whereby $d_i$ and $d_j$ refer to the layer thickness of the corresponding layer applied in the $i^{th}$ or $j^{th}$ repetition of the precursor solution application.

As a result, the texture transfer from the carrier to the HTSL layer is only minimally disrupted, i.e., the finished HTSL has—with the exception of the areas around the pinning centers—an almost perfect crystal lattice, which results in a high critical current density.

In a preferred embodiment, the interface between the HTSL layer and the carrier is free of pinning centers. For example, the HTSL layer in the area between the carrier and the first approximately 100 nm can be free of pinning centers.

The volume of nanoscale pinning centers in the HTSL layer may be in the range of about 5% to about 25% of the total volume of the HTSL layer, and preferably in the range of about 10% to about 20% of the total volume of the HTSL layer.

The invention is further explained with reference to Examples 1 and 2.

EXAMPLE 1

Y(III)-acetate-tetrahydrate ($Y(CH_3COO) \cdot 4H_2O$; Alfa Aesar, 99.9% (REO), crystalline) and Cu(II)-acetate-monohydrate ($Cu(CH_3COO)_2 \cdot H_2O$; Aldrich, $\geq 99.9\%$, crystalline) are dissolved in water. After adding ethanol ($CH_3CH_2OH$; Merck, for synthesis, $\geq 99\%$, melting point: $-114.5°$ C., boiling point: 78.3° C., flash point: 12° C.) and pivalic acid (trimethylacetic acid: $(CH_3)_3CCOOH$; Merck, for synthesis, >98%, melting point: 32-35° C., boiling point: 164° C., flash point: 64° C., solubility in H2O: 25 g/l (25° C.)), the solution that is obtained is dried in a drying oven. The batch of Y(III)- and Cu(II)-trimethyl acetate that is produced is mixed with barium hydroxide octahydrate ($Ba(OH)2 \cdot 8H_2O$; Merck, for analysis, $\geq 98\%$, melting point: 78° C.). By adding propionic acid (methylacetic acid, $CH_3CH_2COOH$; Merck, for synthesis, $\geq 99\%$, melting point: $-21°$ C., boiling point: 141° C., flash point: 50° C.), propylamine (1-aminopropane, $CH_3CH_2CH_2NH_2$; Merck, for synthesis, >99%, melting point: $-83°$ C., boiling point: 48-50° C., flash point: $-30°$ C.), methanol ($CH_3OH$; Merck, for analysis, ACS, ISO, $\geq 99.8\%$, melting point: $-98°$ C., boiling point: 64.5° C., flash point: 11° C.) and toluene (methylbenzene, $C_6H_5CH_3$; Merck, for the spectroscopy, $\geq 99.9\%$, melting point: $-95°$ C., boiling point: 110.6° C., flash point: 4° C.), a 0.1 molar colloidal solution is produced. The selected concentration produces a small end layer thickness. For the first coating, concentrations of about 0.001 M up to about 0.2 M based on the additional process parameters are optimal. Strontium titanate substrates (orientation (100)) as well as metal bands that were provided with buffer layers and that consisted of an alloy Ni with 5 at % W were coated by the dip-coating process. The dwell time in the solution was a maximum of 15 s. The samples were removed from the solution at an extraction rate of 0.1 cm/s. The extraction rate can vary within a wide range of from about 0.04 cm/s to about 0.5 cm/s, whereby a lower extraction rate produces a smaller layer thickness and a higher extraction rate produces a larger layer thickness. The drying of the layer was carried out at temperatures up to a maximum of 200° C. in a drying oven. The subsequent pyrolysis was performed at $T \leq 600°$ C. in a chamber furnace in air.

The substrates with the first pyrolyzed layer were then immersed in a YBCO-TFA precursor suspension with different contents of various nanoparticles with a dwell time of a maximum of 15 s and an extraction rate of 0.1 cm/s. The YBCO-TFA precursor suspensions were produced as solvents from Y(III)-acetate-tetrahydrate ($Y(CH_3COO) \cdot 4H_2O$; Alfa Aesar, 99.99% (REO), crystalline), Ba(II)-acetate ($Ba(CH_3COO)_2$; Alfa Aesar, 99.999% (metal base) and Cu(II)-acetate-monohydrate ($Cu(CH_3COO)_2 \cdot H_2O$; Aldrich, $\geq 99.99\%$, crystalline) with use of trifluoroacetic acid ($CF_3COOH$; Merck, for synthesis, >99%, melting point: $-15°$ C., boiling point: 72° C.) and methanol ($CH_3OH$; Merck, for analysis, >99.8%, melting point: $-98°$ C., boiling point: 64.5° C., flash point: 11° C.). The concentration was 0.25 M relative to Y. The compositions of the solutions were established according to Y:Ba:Cu=1:2:3.

Precursor Suspension 1:
  1% by weight of $ZrO_2$ particles, mean grain size 55 nm
Precursor Suspension 2:
  5% by weight of $ZrO_2$ particles, mean grain size 55 nm
Precursor Suspension 3:
  2% by weight of $Y_2O_3$ particles, mean grain size 40 nm The layers that were obtained were heat-treated in a humid atmosphere. The pyrolysis was carried out at $T \leq 400°$ C. in $N_2/2.5\%\ O_2$ atmosphere. The YBCO phase formation was performed under an atmosphere of $N_2/100$ ppm of $O_2$ at maximum temperatures of 780 to 790° C. and with a holding time of between one half-hour and one hour. The maximum temperature was always below the melting point of the YBCO. The melting point in turn is based on the oxygen concentration of the oven atmosphere. At higher oxygen contents of up to 1%, the melting point is increased by about 10°; with an oxygen-free atmosphere, it is reduced by about 5°. The cooling of the samples was carried out in $O_2$ atmosphere with a holding time of 2 hours at a temperature of between 500 and 400° C. Typical results are:

Sample 1 (Precursor Suspension 1), Substrate STO:
  $T_{C50}$=89.8 K, $\Delta T_C$=1 K, $J_C$ (resistive)=1.05 MA/cm$^2$
  Layer thickness 1 (without nanoparticles): $\approx$210 nm
  Layer thickness 2 (with nanoparticles): $\approx$480 nm
  $J_C(5T)/J_C(0T)$=2.1
Sample 2 (Precursor Suspension 2), Substrate STO:
  $T_{C50}$=89.5 K, $\Delta T_C$=1.8 K, $J_C$ (resistive)=0.8 MA/cm$^2$ Layer thickness 1 (without nanoparticles): ≈210 nm
Layer thickness 2 (with nanoparticles): ≈500 nm
$J_C(5T)/J_C(0T)=3.1$
Sample 3 (Precursor Suspension 1), Substrate STO:
$T_{C50}=89.7$ K, $\Delta T_C=0.8$ K, $J_C$ (resistive)=1.15 MA/cm$^2$
Layer thickness 1 (without nanoparticles): ≈210 nm
Layer thickness 2 (with nanoparticles): ≈450 nm
$J_C(5T)/J_C(0T)=2.8$

EXAMPLE 2

First, a buffer layer system was applied to a textured metal band (Ni with 5 at % W). Also, other nickel alloys, such as, e.g., Ni with 0.1% Mn, can be used without influencing the final result of this example.

Lanthanum(III) and zirconium(IV)-(2,4)pentanedionate (acetyl acetonate) (lanthanum (III)-(2,4)pentanedionate, La[CH$_3$COCHCOCH$_3$]$_3$·xH$_2$O; Alfa Aesar, 99.9% (REO), powder, melting point: 143° C.; zirconium(IV)-(2,4)pentanedionate, Zr[CH$_3$COCHCOCH$_3$]$_4$; Strem Chemicals, ≧98%, crystalline) are the basis of the coating solution for a first buffer layer. The solution was set at a concentration of 0.1 M relative to La$_2$Zr$_2$O$_7$ according to buffer stoichiometry. For specified setting of the metal contents, the starting substances were characterized by means of ICP-OES (Inductively Coupled Plasma Optical Emission Spectroscopy). As a solvent for the solution, propionic acid (propionic acid, CH$_3$CH$_2$COOH:; Merck, ≧99%, melting point: −21° C., boiling point: 141° C., flash point: 50° C.) was used.

The coating was carried out on substrate bands with a cross-section of 5×0.1 mm$^2$ and a length of 50 m in a continuous coating apparatus.

This apparatus may include a rinsing unit, a coating unit, a drying unit and a winding unit. The band may be pulled through the system under a drawing force of about 10 N at a rate of about 5 cm/minute. In this case, the tensile force is selected such that it is less than the yield point of the metal band that is used. The coating may be carried out at a pull-out angle of about 70° relative to the solution surface. The pull-out angle can be varied within a range of 20-90°, whereby a smaller angle means a larger layer thickness. Equal layer thicknesses can be achieved with, e.g., the combination of 70° and 5 cm/min as well as 90° and 5.8 cm/min. The drying may be carried out in two steps. First, the pre-drying may be carried out below the boiling point of the solvent (methanol; 65° C.) at temperatures of 60° C. on a 50 cm segment. Second, the final drying may be carried out on a 100 cm segment at a temperature of 90° C. After drying, the band is wound up in the form of a spiral (solenoid) on a ceramic pipe (corundum) with a diameter of 20 cm and a length of 100 cm.

The band was moved with the carrier pipe into an annealing furnace and crystallized at a temperature of about 850° C. to about 1100° C. within about two hours.

As a second buffer layer, cerium oxide was applied. The coating solution consists here of Ce(III)-acetate dissolved in propionic acid, 2-propanol and acetyl acetone (Ce(III)-acetate, Ce(CH$_3$COO)$_3$·xH$_2$O; Sigma-Aldrich Chemie, 99.9% and propionic acid, CH$_3$CH$_2$COOH; Merck, ≧99%, melting point: −21° C., boiling point: 141° C., flash point: 50° C. and 2-propanol (isopropanol), (CH$_3$)$_2$CHOH; Sigma-Aldrich Chemie, 99.5%, boiling point 82° C. and acetyl acetone, CH$_3$COCH$_2$COCH$_3$; Sigma-Aldrich Chemie, >99%, boiling point 140° C. The solvents had the ratio 5:2:1, whereby it can be varied within a wide range with proportions of propionic acid >about 20%. The solution concentration was set at 0.25 M. The coating solution was applied analogously to the first coating solution. The crystallization was carried out at temperatures of about 900° C. to about 1050° C. within about one hour.

After exchange of the buffer coating solution in the continuous coating system for a TFA-YBCO coating solution, the band that was obtained was moved through the system at a rate of about 6 cm/minute under otherwise unaltered conditions and in turn wound on a ceramic carrier pipe.

The YBCO-TFA precursor solution was produced as a solvent from Y(III)-acetate-tetrahydrate (Y(CH$_3$COO)·4H$_2$O; Alfa Aesar, 99.99% (REO), crystalline), Ba(II)-acetate (Ba(CH$_3$COO)$_2$; Alfa Aesar, 99.999% (metal base)) and Cu(II)-acetate-monohydrate (Cu(CH$_3$COO)$_2$·H$_2$O; Aldrich, ≧99.99%, crystalline) with use of trifluoroacetic acid (CF$_3$COOH; Merck, for synthesis, >99%, melting point: −15° C., boiling point: 72° C.) and methanol (CH$_3$OH; Merck, for analysis, >99.8%, melting point: −98° C., boiling point: 64.5° C., flash point: 11° C.). The concentration was 0.1 M relative to Y. The compositions of the solutions were set according to Y:Ba:Cu=1:2:3.

The applied layer was then pyrolyzed on the ceramic carrier pipe at about 600° C. under air. The temperature must be at least about 550° C.

After renewed exchange of the coating solution for a coating suspension that consists of a TFA-YBCO precursor solution of the concentration 0.25 M relative to Y, with the addition of 3% by weight of Y$_2$O$_3$ nanopowder of the mean grain size 40 μm, in turn, a passage through the system at a rate of 0.2 cm/s was carried out.

The band with the obtained layers was heat-treated on the ceramic carrier pipe in humid atmosphere. The pyrolysis was carried out at T≦400° C. in N$_2$/2.5% O$_2$ atmosphere. The crystallization was performed under an atmosphere of N$_2$/100 ppm of O$_2$ at maximum temperatures from 780 to 790° C. and with a holding time of between about one-half hour and one hour. In this case, the maximum temperature is always below the melting point of the YBCO. The melting point, in turn, depends on the oxygen concentration of the furnace atmosphere. At higher oxygen contents of up to 1%, the melting point is increased by about 10°, and reduced by about 5° in the case of oxygen-free atmosphere. The cooling of the samples was carried out in O$_2$ atmosphere with a holding time of about two hours at a temperature of between about 500 and 400° C. Typical results are:

Sample 4, Buffered Metal Substrate:
$T_{C50}=89.5$ K, $\Delta T_C=1.5$ K, $J_C$ (resistive)=0.9 MA/cm$^2$
Layer thickness 1 (without nanoparticles): ≈190 nm
Layer thickness 2 (with nanoparticles): ≈510 nm
$J_C(5T)/J_C(0T)=2.5$ While the present invention has been described in detail and with reference to specific embodiments thereof, it will be apparent to one skilled in the art that various changes and modifications can be made therein without departing from the spirit and scope thereof. Thus, it is intended that the present invention covers the modifications and variations of this invention provided they come within the scope of the appended claims and their equivalents.

I claim:
1. A wet-chemical process for the production of a textured, band-shaped HTSL with pinning centers, the method comprising:
  (a) applying a base precursor solution to a textured carrier having a concentration of pinning centers $c_0$;
  (b) drying the precursor solution to form a base precursor layer;

(c) annealing the layer to form a high temperature superconductor layer; and (d) repeating at least the applying step (a) and the drying step (b) to form an additional precursor layer disposed over the base precursor layer, wherein:
  the applying and drying steps are repeated i times, i being a natural number greater than 0; and
  each additional precursor layer applied during the repetition step (d) comprises a concentration of pinning centers $c_i$, wherein:
  the concentration $c_0$ of pinning centers in the base precursor solution is less than the concentration $c_1$ of pinning centers in the additional precursor solution applied during the first repetition step (d) such that $0<c_0<c_1$,
  the repetition step (d) includes an $i^{th}$ and $j^{th}$ repetition of step (a),
  $d_i<d_j$, with $d_i$ designating the layer thickness of the layer applied during the $i^{th}$ repetition step (a) and $d_j$ designating the layer thickness of the layer applied during the $j^{th}$ repetition of step of (a),
  $c_i<c_j$, applies to layers i, j, with $c_i$ designating the concentration of the pinning centers of the precursor solution applied during the $i^{th}$ repetition of step (a) and $c_j$ designating the concentration of pinning centers of the precursor solution applied during the $j^{th}$ repetition of step of (a).

2. The process of claim 1, wherein $c_0 \leq \frac{1}{10} c_1$.

3. The process of claim 1, wherein a thickness of the precursor solution applied in the repetition (d) is greater than the thickness of the base precursor layer applied in (a).

4. The process of claim 1, wherein pinning centers are formed by nanoparticles with a mean grain size of less than about 110 nm.

5. The process of claim 4, wherein the mean grain size of the nanoparticles is between about 2 nm and about 80 nm.

6. The process of claim 4, wherein the mean grain size of the nanoparticles is between about 5 nm and about 60 nm.

7. The process of claim 4, wherein the nanoparticles are substantially inert compared to material forming the HTSL and its educts.

8. The process of claim 4, wherein a length of at least one component of a lattice vector of the nanoparticles deviates no more than about 10% from a length of a component of a lattice vector of the HTSL.

9. The process of claim 1, wherein at least a portion of the pinning centers is formed from a substance comprising one or more of zirconium oxide; stabilized zirconium oxide; cerium oxide; barium zirconate; lanthanum zirconate; yttrium oxide; and $RE_2Ba_4CaMo_y$, wherein RE is any rare-earth metals; M is Zr, Nb, Mo, Ru, Hf, Ta, W or Sn; and y is a rational number that is greater than zero.

10. A band-shaped HTSL comprising:
  a carrier; and
  a wet chemical process HTSL layer, the HTSL layer comprising a first precursor layer disposed on the carrier, a second precursor layer disposed over the first precursor layer, and a third precursor layer disposed over the second precursor layer, wherein the thickness of the second precursor layer is greater than the thickness of each the first precursor layer and the third precursor layer,
  wherein the concentration of pinning centers in the layers alternates such that the pinning center concentration of the first layer is less than the pinning center concentration of the second layer, and the pinning center concentration of the second layer is greater than the pinning concentration of the third layer.

11. The band shaped HTSL of claim 10, wherein the first precursor layer is substantially free of pinning centers.

12. The band-shaped HTSL of claim 10, wherein the pinning centers are formed by nanoparticles with a mean grain size of less than about 110 nm.

13. The band-shaped HTSL of claim 12, wherein the mean grain size of the nanoparticles is between about 2 nm and about 80 nm.

14. The band-shaped HTSL of claim 12, wherein the mean grain size of the nanoparticles is between about 5 nm and about 60 nm.

15. The band-shaped HTSL of claim 12, wherein the nanoparticles are substantially inert compared to material forming the HTSL layer and its educts.

16. The band-shaped HTSL of claim 12, wherein a length of at least one component of a lattice vector of the nanoparticles deviates no more than about 10% from a length of a component of the lattice vector of the HTSL layer.

17. The band-shaped HTSL of claim 10, wherein a volume proportion of the pinning centers in the HTSL layer is between about 5% and about 25%.

18. The band-shaped HTSL of claim 10, wherein a volume proportion of the pinning centers in the HTSL layer is between about 10% and about 20%.

19. The band-shaped HTSL of claim 10, wherein at least a portion of the pinning centers is formed from a substance comprising one or more of zirconium oxide; stabilized zirconium oxide; cerium oxide; barium zirconate; lanthanum zirconate; yttrium oxide; and $RE_2Ba_4CaMo_y$, wherein RE is any rare-earth metals; M is Zr, Nb, Mo, Ru, Hf, Ta, W or Sn; and y is a rational number that is greater than zero.

20. A wet-chemical process for the production of a band-shaped HTSL layer with pinning centers, the method comprising:
  (a) applying a first precursor solution to a carrier;
  (b) drying the solution to form a first precursor layer;
  (c) applying a second precursor solution the first precursor layer;
  (d) drying the second precursor solution to form a second precursor layer;
  (e) applying a third precursor solution to the second precursor layer;
  (f) drying the third precursor solution to form a third precursor layer; and
  (e) annealing the precursor layers to form a high temperature superconductor layer, wherein the concentration of pinning centers in the first precursor solution $c_1$ is less than the concentration of pinning centers in each of the second precursor solution $c_2$ and the third precursor solution $c_3$, and wherein the concentration of pinning centers in the third precursor solution $c_3$ is less than the concentration of the pinning centers in the second precursor solution $c_2$.

21. The process of claim 20, wherein the concentration of pinning centers in the first precursor solution $c_1$ equals less than about 10% of the concentration of pinning centers in the second precursor solution $c_2$.

22. The process of claim 20, wherein the first precursor solution is substantially free of pinning centers.

23. The process of claim 20, wherein the thickness of the first precursor layer is less than the thickness of the second precursor layer.

24. The process of claim 20, wherein at least a part of the pinning centers comprise zirconium oxide and/or stabilized zirconium oxide and/or cerium oxide and/or barium zirconate and/or lanthanum zirconate and/or yttrium oxide and/or $RE_2Ba_4CaMo_y$, with RE standing for random rare earth metals, M for Zr, Nb, Mo, Ru, Hf, Ta, W or Sn, and y for a rational number larger than zero.

25. The process of claim 20, wherein nanoparticles with a mean grain size of less than 110 nm form the pinning centers.

26. The process of claim 20, wherein the mean grain size of the nanoparticle is between 2 nm and 80 nm.

27. The process of claim 25, wherein the nanoparticles are substantially inert towards the HTSC material and its educts.

28. The process of claim 25, wherein the length of at least one component of the lattice vector of the nanoparticles deviates by not more than 10% from the length of a component of the lattice vector of the HTSC layer.

29. A wet-chemical process for the production of a textured, band-shaped HTSL with pinning centers, the method comprising:
   (a) applying a base precursor solution to a textured carrier having a concentration of pinning centers $c_o$;
   (b) drying the precursor solution to form a base precursor layer;
   (c) annealing the layer to form a high temperature superconductor layer; and
   (d) repeating at least the applying step (a) and the drying step (b) to form an additional precursor layer disposed over the base precursor layer, wherein:
      the applying and drying steps are repeated i times, with i being a natural number greater than 0; and
      each additional precursor layer applied during the repetition step (d) comprises a concentration of pinning centers $c_i$, with $c_i$ designating the concentration of the pinning centers in the precursor solution applied during the repetition of step (a) as designated by the index,
   wherein the concentration $c_0$ of pinning centers in the base precursor solution is less than the concentration $c_1$ of pinning centers in the additional precursor solution applied during the first repetition step (d) such that $0<c_0<c_1$, and wherein $c_i<c_{i+1}$, with i being an even natural number greater than 0.

30. The process of claim 29, wherein a thickness of the precursor solution applied in the repetition (d) is greater than the thickness of the base precursor layer applied in (a).

31. The process of claim 29, wherein at least a part of the pinning centers comprise zirconium oxide and/or stabilized zirconium oxide and/or cerium oxide and/or barium zirconate and/or lanthanum zirconate and/or yttrium oxide and/or $RE_2Ba_4CaMo_y$, with RE standing for random rare earth metals, M for Zr, Nb, Mo, Ru, Hf, Ta, W or Sn, and y for a rational number larger than zero.

32. The process of claim 29, wherein nanoparticles with a mean grain size of less than 110 nm form the pinning centers.

33. The process of claim 32, wherein the mean grain size of the nanoparticle is between 2 nm and 80 nm.

34. The process of claim 29, wherein the nanoparticles are substantially inert towards material forming the HTSC layer.

35. The process of claim 29, wherein the length of at least one component of the lattice vector of the nanoparticles deviates by not more than 10% from the length of a component of the lattice vector of the HTSC layer.

36. The process of claim 29, wherein $c_0 \leq \frac{1}{10} c_1$.

* * * * *